United States Patent
Ishikawa et al.

(10) Patent No.: US 12,474,630 B2
(45) Date of Patent: Nov. 18, 2025

(54) PELLICLE DEMOUNTING METHOD AND PELLICLE DEMOUNTING PREPROCESSING DEVICE

(71) Applicant: MITSUI CHEMICALS, INC., Tokyo (JP)

(72) Inventors: Akira Ishikawa, Ichihara (JP); Kazuo Kohmura, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 160 days.

(21) Appl. No.: 17/771,981

(22) PCT Filed: Dec. 10, 2020

(86) PCT No.: PCT/JP2020/046071
§ 371 (c)(1),
(2) Date: Apr. 26, 2022

(87) PCT Pub. No.: WO2021/117816
PCT Pub. Date: Jun. 17, 2021

(65) Prior Publication Data
US 2022/0365422 A1 Nov. 17, 2022

(30) Foreign Application Priority Data
Dec. 13, 2019 (JP) .................................. 2019-225699

(51) Int. Cl.
*G03F 1/64* (2012.01)

(52) U.S. Cl.
CPC .................................... *G03F 1/64* (2013.01)

(58) Field of Classification Search
CPC .................. G03F 1/64; G03F 1/24; G03F 1/22
See application file for complete search history.

(56) References Cited

U.S. PATENT DOCUMENTS

| | | | |
|---|---|---|---|
| 4,996,106 A | | 2/1991 | Nakagawa et al. |
| 5,616,927 A | * | 4/1997 | Kubota .................... G03F 1/64 |
| | | | 430/4 |
| 2007/0292775 A1 | | 12/2007 | Hamada |

(Continued)

FOREIGN PATENT DOCUMENTS

| | | |
|---|---|---|
| JP | H07120931 A | 5/1995 |
| JP | 2012037609 A * | 2/2012 |

(Continued)

OTHER PUBLICATIONS

Takamura, Machine Translation of JP2016206527A, 2016 (Translation accessed Jan. 30, 2024) (Year: 2016).*

(Continued)

*Primary Examiner* — Andrew L Swanson
(74) *Attorney, Agent, or Firm* — BUCHANAN INGERSOLL & ROONEY PC

(57) ABSTRACT

A pellicle demounting method includes providing a stack including a photomask, a pellicle frame, and a pellicle film that are arranged in this order, forming of a pressure-sensitive adhesive layer on the pellicle film in the stack, and a demounting step of demounting at least the pellicle film and the pressure-sensitive adhesive layer from the photomask in the stack having the pressure-sensitive adhesive layer formed thereon.

9 Claims, 10 Drawing Sheets

(56) References Cited

U.S. PATENT DOCUMENTS

2019/0094683 A1* 3/2019 Yoo .......................... G03F 1/82

FOREIGN PATENT DOCUMENTS

JP 2016206527 A * 12/2016
KR 10 1991 0004848 B1 7/1991

OTHER PUBLICATIONS

Machine Translation of Akihiko, Espacenet, Generated Apr. 15, 2024 (Year: 2012).*
Machine Translation of Takamura, Espacenet, Generated Apr. 15, 2024 (Year: 2016).*
Partial Human Translation of Takamura (U.S. Pat. No. 2016206527—previously of record) provided by STIC, 2016 (Translation Generated Mar. 19, 2025) (Year: 2016).*

* cited by examiner

PELLICLE DEMOUNTING METHOD AND PELLICLE DEMOUNTING PREPROCESSING DEVICE

TECHNICAL FIELD

The present disclosure relates to a pellicle demounting method and a pellicle pre-demounting processing device.

BACKGROUND ART

Increase in the degree of integration of semiconductor devices and downsizing of semiconductor devices have been accelerating year by year. For example, patterns having a line width of about 45 nm are formed by light exposure using excimer at present, but it has recently been requested to form patterns having a line width of 32 nm or less due to further enhancement of fineness of semiconductor devices. Such fine processing is difficult to perform using conventional light exposure using excimer. In view of this situation, studies have been made with respect to replacement of the exposure light by extreme ultra violet (EUV) light having a shorter wavelength.

EUV light has a property such that EUV light is easily absorbed by any substances. In photolithography using EUV light as a light for exposure (hereinafter also referred to as "EUV lithography"), exposure to light is performed using a reflective optical system. Specifically, EUV light is reflected by a photomask (for example, a reticle or the like) on which an exposure pattern is reflected, and a resist is exposed to the EUV light as the reflected light.

In the photolithography step, when contaminants attach to the photomask, the EUV light may be absorbed by the contaminants and scattered thereby, and exposure to the light does not occur in the desired pattern in some cases. In consideration of this, a pellicle is mounted on (i.e., attached to) a side of the photomask that is to be irradiated with EUV light, thereby protecting the photomask.

The configuration of the pellicle includes a pellicle film for protecting a face of the photomask that is to be irradiated with EUV light, and a pellicle frame that supports the pellicle film.

A pellicle mounted on a photomask may experience contamination with dust or the like, deterioration by light, and the like. In these cases, the necessity to replace the pellicle may arise, and, for this purpose, the necessity to demount (i.e., detach) the pellicle mounted on a photomask may arise.

The pellicle demounting method described in Patent Document 1, for example, is known as a conventional method for demounting a pellicle from a photomask. In Patent Document 1, a pellicle demounting method is disclosed in which at least a pellicle film of a pellicle disposed on a photomask is allowed to tightly contact with a sheet, and in which the pellicle is demounted from the photomask.

Patent Document 1: Japanese Patent Application Laid-open (JP-A) No. 2016-206527

SUMMARY OF INVENTION

Problem to be Solved by Invention

A problem to be solved by an embodiment of the present disclosure is to provide a pellicle demounting method having excellent property with respect to reduction of contamination of a photomask.

Means for Solving the Problem

Means for solving the foregoing problem include the following embodiments.

<1> A pellicle demounting method, including:
  a step of providing a stack including a photomask, a pellicle frame, and a pellicle film that are arranged in this order;
  a step of forming a pressure-sensitive adhesive layer on the pellicle film in the stack; and
  a demounting step of demounting at least the pellicle film and the pressure-sensitive adhesive layer from the photomask in the stack having the pressure-sensitive adhesive layer formed thereon.

<2> The pellicle demounting method according to <1>, wherein, in the step of forming a pressure-sensitive adhesive layer, the pressure-sensitive adhesive layer is formed using a spray coating method, a spin coating method, an inkjet method, a screen printing method, or a dip coating method.

<3> The pellicle demounting method according to <1>, wherein, in the step of forming a pressure-sensitive adhesive layer, the pressure-sensitive adhesive layer is formed using a spray coating method.

<4> The pellicle demounting method according to any one of <1> to <3>, wherein the pressure-sensitive adhesive layer includes at least one pressure-sensitive adhesive selected from the group consisting of a silicone-based pressure-sensitive adhesive, an acrylic pressure-sensitive adhesive, a urethane-based pressure-sensitive adhesive, a polyamide-based pressure-sensitive adhesive, a polyester-based pressure-sensitive adhesive, an ethylene-vinyl acetate copolymer, an olefin-based pressure-sensitive adhesive, a polybutadiene-based pressure-sensitive adhesive, a rubber-based pressure-sensitive adhesive, and a styrene-based pressure-sensitive adhesive.

<5> The pellicle demounting method according to any one of <1> to <4>, wherein the stack further includes a mask adhesion layer provided between the photomask and the pellicle frame.

<6> The pellicle demounting method according to <5>, wherein, in a case in which the stack is designated as a first stack, the demounting step includes:
  demounting the pellicle film and the pressure-sensitive adhesive layer while leaving the pellicle frame at the photomask-side part of the first stack having the pressure-sensitive adhesive layer formed thereon, to obtain a second stack that includes the photomask, the mask adhesion layer, and the pellicle frame;
  heat-treating the second stack; and
  demounting the pellicle frame from the photomask in the second stack.

<7> The pellicle demounting method according to any one of <1> to <6>, further including a step of heat-treating the stack prior to the demounting step.

<8> The pellicle demounting method according to any one of <1> to <7>, wherein at least one of a recess portion or a cutout is provided on an outer peripheral face of the pellicle frame.

<9> The pellicle demounting method according to any one of <1> to <8>, wherein a through-hole penetrating through the pellicle film and the pellicle frame in a thickness direction is provided at the stack.

<10> The pellicle demounting method according to any one of <1> to <9>, further including a step of adhering, in a pressure-sensitive manner, a protective film onto the pressure-sensitive adhesive layer formed on the stack after the step of forming a pressure-sensitive adhesive layer but before the demounting step, wherein the demounting step includes demounting at least the protective film, the pressure-sensitive adhesive layer, and the pellicle film from the photomask in the stack having the protective film adhered thereto.

<11> A pellicle pre-demounting processing device for performing the step of forming a pressure-sensitive adhesive layer in the pellicle demounting method of any one of <1> to <10>, the device including:
  a stage unit configured such that the stack is placed with the pellicle film located at the upper side and the photomask located at the lower side; and
  a discharge unit configured to discharge a pressure-sensitive adhesive onto the pellicle film in the stack placed on the stage unit.

<12> The pellicle pre-demounting processing device according to <11>, wherein a discharge method used in the discharge unit is a spray method, and the pressure-sensitive adhesive is applied by a spray coating method, to form the pressure-sensitive adhesive layer.

<13> The pellicle pre-demounting processing device according to <11>, wherein the stage unit has a rotation function, and the pressure-sensitive adhesive is applied by a spin coating method, to form the pressure-sensitive adhesive layer.

Advantageous Effect of Invention

According to the present disclosure, a pellicle demounting method having excellent property with respect to reduction of contamination of a photomask is provided.

MODES FOR CARRYING OUT THE INVENTION

Figure 1:
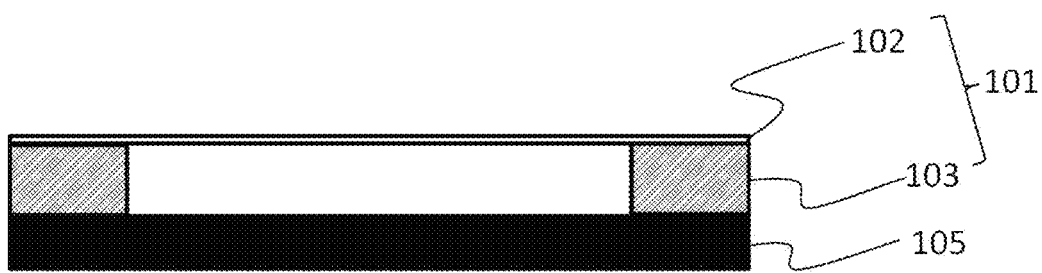
FIG. 1 is a schematic cross-sectional view schematically illustrating one example of a stack that is provided in a step of providing a stack in a pellicle demounting method according to the present disclosure.

In the present specification, any numerical range expressed using "to" means a range including numerical values described before and after "to" as a lower limit value and an upper limit value. For numerical value ranges described in a stepwise manner in the present specification, the upper limit value or the lower limit value of one numerical value range may be replaced with the upper limit value or the lower limit value of another numerical value range in the stepwise description. The upper limit value or the lower limit value of any numerical value range described in the present specification may also be replaced with a value described in Examples.

In the present specification, a combination of preferable aspects constitutes a more preferable aspect.

In the present specification, the term "step" encompasses not only an independent step, but also a step that cannot be clearly distinguished from other steps as long as the intended purpose of the step is achieved.

In the present specification, extreme ultraviolet (EUV) light refers to a light having a wavelength of from 5 nm to 30 nm. The wavelength of the EUV light is preferably a wavelength of from 5 nm to 13.5 nm.

In the present specification, EUV light and lights having shorter wavelengths than EUV light are sometimes collectively referred to as "EUV light and the like".

In the present specification, the term "pellicle" refers to a structure that includes a pellicle frame and a pellicle film supported at one thickness-direction end face side of the pellicle frame.

The configuration of the pellicle may be a configuration (see FIG. 1) in which a pellicle film is directly supported at one thickness-direction end face side of a pellicle frame (i.e., without the presence of another element therebetween), or a configuration in which a pellicle film is supported at one thickness-direction end face side of a pellicle frame with one or more other elements (for example, a pellicle film adhesion layer, a pellicle film support frame, a support frame adhesion layer, or the like) disposed therebetween.

In the present specification, the term "pellicle demounting method" refers to a method of demounting (i.e., detaching) at least a pellicle film from a photomask on which the pellicle has been mounted.

The scope of the pellicle demounting method encompasses both of:
a method of demounting the pellicle film while leaving the pellicle frame on the photomask on which the pellicle has been mounted; and
a method of demounting both of the pellicle film and the pellicle frame (i.e., the entire pellicle) from the photomask on which the pellicle has been mounted.

The scope of the pellicle demounting method encompasses a method of demounting (i) only the pellicle film or both of the pellicle film and the pellicle frame, and (ii) another element (for example, a pressure-sensitive adhesive layer, a protective film, or the like).

The scope of the pellicle demounting method encompasses a method of detaching the pellicle from the photomask while destroying the pellicle.

Pellicle Demounting Method

A pellicle demounting method according to the present disclosure includes:
a step of providing a stack including a photomask, a pellicle frame, and a pellicle film that are arranged in this order;
a step of forming a pressure-sensitive adhesive layer on the pellicle film in the stack; and
a demounting step of demounting at least the pellicle film and the pressure-sensitive adhesive layer from the photomask in the stack having the pressure-sensitive adhesive layer formed thereon.

A pellicle film is a film having an extremely small thickness. For example, pellicle films used in EUV lithography have thicknesses on the order of nanometers. Therefore, breakage (including the concept of destruction; the same shall apply hereinafter) of a pellicle film is likely to occur when the pellicle is demounted from a photomask, and, in some cases, the photomask is contaminated by pellicle film pieces generated by breakage of the pellicle film. In particular, the self-standing portion of the pellicle film (i.e., a portion that is positioned above the opening area defined by the inner peripheral face of the pellicle frame and that is not supported by the pellicle frame) is likely to break.

In order to address the foregoing problem, the pellicle demounting method according to the present disclosure includes, before demounting a pellicle film from the photomask, forming a pressure-sensitive adhesive layer on the pellicle film in a stack including a photomask, a pellicle frame, and the pellicle film that are arranged in this order, and thereafter demounting at least the pellicle film and the pressure-sensitive adhesive layer from the photomask in the stack having the pressure-sensitive adhesive layer formed thereon. With this process design, even when the pellicle film is broken during demounting, pellicle film pieces generated by the breakage of the pellicle film are trapped by being adhered to the pressure-sensitive adhesive layer, whereby scattering of the pellicle film pieces is reduced. As a result, contamination of the photomask due to scattering of the pellicle film pieces is reduced.

The pellicle demounting method according to the present disclosure differs from the pellicle demounting method described in Patent Document 1 (i.e., a method in which at least a pellicle film of a pellicle disposed on a photomask is allowed to tightly contact with a sheet, and in which the pellicle is demounted from the photomask) in that the pressure-sensitive adhesive layer is formed, in advance, on the pellicle film prior to demounting in the pellicle demounting method according to the present disclosure. Owing to this difference, the pellicle demounting method according to the present disclosure can reduce scattering of pellicle film pieces and contamination of the photomask caused by the scattering of pellicle film pieces, compared to the pellicle demounting method described in Patent Document 1.

An example according to the present disclosure is described by referring to drawings, as appropriate. However, the present disclosure is not limited to specific examples such as the following figures.

An element that is common to multiple figures is assigned the same reference character, and overlapping explanations thereof are omitted in some cases. Further, in the figures, a part of a hidden line is omitted in some cases in order to increase the visibility of the structure.

FIG. 1 is a schematic cross-sectional view schematically illustrating one example of a stack that is provided in the step of providing a stack in the pellicle demounting method according to the present disclosure.

As illustrated in FIG. 1, the stack according to the present example includes a photomask 105, a pellicle frame 103, and a pellicle film 102, which are arranged in this order. The stack according to the present example can be obtained by mounting, on a photomask 105, a pellicle 101 that includes the pellicle film 102 and the pellicle frame 103.

The pellicle frame 103 supports the pellicle film 102 at one thickness-direction end face side of the pellicle frame 103. In other words, a part of the pellicle 102 that overlaps the pellicle frame 103 in a plan view is supported by the pellicle frame 103. A part of the pellicle film 102 that overlaps the opening area defined by the inner peripheral face of the pellicle frame 103 in a plan view is not supported, and is a self-standing portion (i.e., the film is present by itself rather than being formed on an underlying base).

Figure 2A:
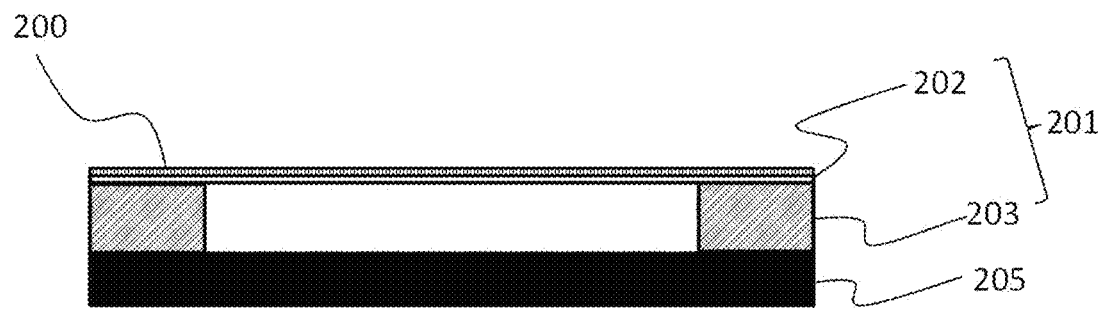
FIG. 2A is a schematic cross-sectional view schematically illustrating one example of a state in which a pressure-sensitive adhesive layer has been formed on a pellicle film in a stack via a step of forming a pressure-sensitive adhesive layer in a pellicle demounting method according to the present disclosure.

FIG. 2A is a schematic cross-sectional view schematically illustrating one example of a state in which a pressure-sensitive adhesive layer has been formed on a pellicle film in the stack via the step of forming a pressure-sensitive adhesive in the pellicle demounting method according to the present disclosure.

A photomask 205, a pellicle frame 203, and a pellicle film 202 shown in FIG. 2A are substantially the same as the photomask 105, the pellicle frame 103, and the pellicle film 102 shown in FIG. 1, respectively.

In the step of forming a pressure-sensitive adhesive layer, a pressure-sensitive adhesive layer 200 is formed on the pellicle film 202 in the stack, as illustrated in FIG. 2A.

Figure 2B:
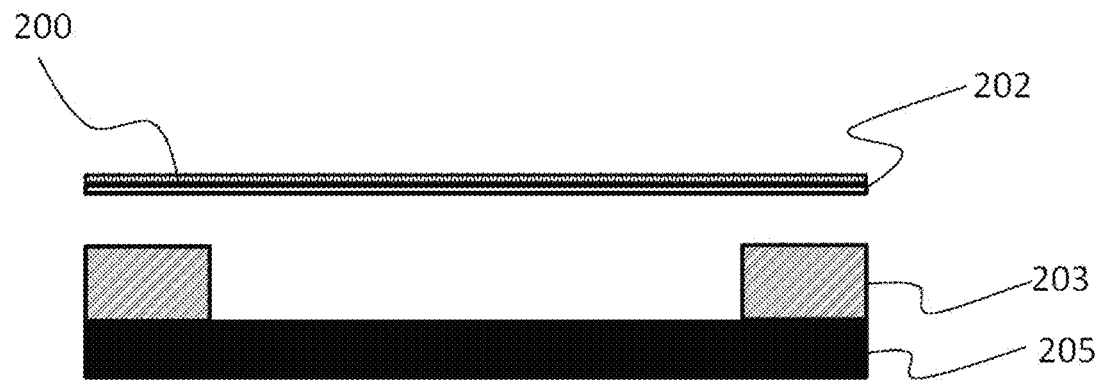
FIG. 2B is a schematic cross-sectional view schematically illustrating one example of a state in which the pellicle film and the pressure-sensitive adhesive layer have been demounted from a photomask in the stack shown in FIG. 2A having the pressure-sensitive adhesive layer formed thereon.

FIG. 2B is a schematic cross-sectional view schematically illustrating one example of a state in which the pellicle film and the pressure-sensitive adhesive layer have been demounted from the photomask in the stack on which the pressure-sensitive adhesive layer shown in FIG. 2A has been formed.

In the demounting step according to the present example, the pellicle film 202 and the pressure-sensitive adhesive layer 200 are demounted from the photomask 205 in the stack shown in FIG. 2A having the pressure-sensitive adhesive layer formed thereon, as illustrated in FIG. 2B. Thereafter, the pellicle frame 203 is also demounted from the photomask 205, if necessary.

Figure 3:
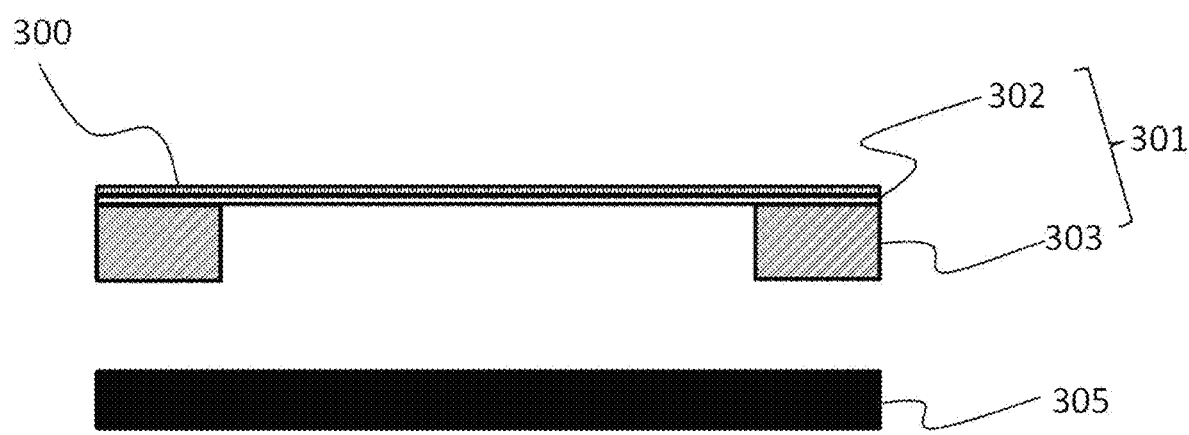
FIG. 3 is a schematic cross-sectional view schematically illustrating one example of a state in which a pellicle frame, a pellicle film, and a pressure-sensitive adhesive layer have been demounted from a photomask in a stack having the pressure-sensitive adhesive layer formed thereon, via the demounting step in the pellicle demounting method according to the present disclosure.

FIG. 3 is a schematic cross-sectional view schematically illustrating one example of a state in which the pellicle frame, the pellicle film, and the pressure-sensitive adhesive layer have been demounted from the photomask in the stack having the pressure-sensitive adhesive layer formed thereon via the demounting step in the pellicle demounting method according to the present disclosure.

The example illustrated in FIG. 3 is a variant modified from the example illustrated in FIG. 2B.

A photomask 305, a pellicle frame 303, and a pellicle film 302 shown in FIG. 3 are substantially the same as the photomask 205, the pellicle frame 203, and the pellicle film 202 shown in FIG. 2B, respectively.

In the demounting step according to this example, the pellicle frame 303, the pellicle film 302, and a pressure-sensitive adhesive layer 300 are demounted from the photomask 305 in the stack having the pressure-sensitive adhesive layer 300 formed thereon, as illustrated in FIG. 3.

Individual steps that may be included in the pellicle demounting method according to the present disclosure are described in more detail below.

Step of Providing Stack

The step of providing a stack is a step of providing a stack including a photomask, a pellicle frame, and a pellicle film that are arranged in this order. The step of providing a stack may be a step of producing the stack, or a step of simply providing the stack that has been produced in advance.

The stack can be produced, for example, by mounting (i.e., attaching) a pellicle that includes a pellicle frame and a pellicle film (more specifically, a pellicle that includes a pellicle frame and a pellicle film supported at one thickness-direction end face side of the pellicle frame) on a photomask.

Pellicle Film

The stack provided in the present step includes a pellicle film. Known pellicle films may be used as the pellicle film. The material contained in the pellicle film is not particularly limited, and may be any of an organic material, an inorganic material, or a mixed material of an organic material and an inorganic material.

The organic material is, for example, a fluorine-containing polymer or the like. Example of the inorganic material include crystalline silicon (for example, monocrystalline silicon, polycrystalline silicon, or the like), diamond-like carbon (DLC), graphite, amorphous carbon, graphene, silicon carbide, silicon nitride, aluminum nitride, and the like.

The pellicle film may include any one of the above materials singly, or a combination of two or more thereof.

The configuration of the pellicle film may be a monolayer configuration or a configuration formed of two or more layers.

The thickness of the pellicle film (total thickness when the pellicle film is formed of two or more layers) is preferably from 2 nm to 200 nm, more preferably from 2 nm to 100 nm, still more preferably from 2 nm to 70 nm, and particularly preferably from 2 nm to 50 nm. The lower limit of the thickness of the pellicle film may be 5 nm or 10 nm.

With respect to the configuration of the pellicle film, known pellicle film configurations, such as those disclosed in, for example, Japanese Patent Application Laid-open (JP-A) No. 2014-021217 and International Publication (WO) No. 2015/174412, may be referenced, if necessary.

Pellicle Frame

The stack provided in the present step includes a pellicle frame. Known pellicle frames that are members having a frame shape may be used as the pellicle frame. The material of the pellicle frame may be an ordinary material used for pellicle frames.

Examples of the material of the pellicle frame include, specifically, aluminum, aluminum alloys (5000 series, 6000 series, 7000 series, and the like), stainless steel, silicon, silicon alloys, iron, iron-based alloys, carbon steel, tool steel, ceramics, metal-ceramic composite materials, resins, and the like. Among them, aluminum and aluminum alloys are more preferable from the viewpoints of light weight and rigidity.

The pellicle frame may have a protective film on a surface thereof. The protective film is preferably a protective film that has resistance to hydrogen radicals present in the light exposure atmosphere and to EUV light.

An example of the protective film is an oxide coating film. The oxide coating film can be formed using known methods such as anode oxidization. The oxide coating film may be colored with a black dye. When the pellicle frame has an oxide coating film colored with a black dye, detection of contaminants on the pellicle frame is easier.

With respect to the configuration of the pellicle frame, known pellicle frame configurations, such as those disclosed in, for example, Japanese Patent Application Laid-open (JP-A) Nos. 2014-021217 and 2010-146027, may be referenced, as appropriate.

The outer peripheral face of the pellicle frame is preferably provided with at least one of a recess portion or a cutout. This configuration makes it easy to demount the pellicle frame from the photomask. For example, the pellicle frame can easily be demounted from the photomask by inserting a grip tool for pellicle frame handling into the recess portion or the cutout, or by allowing the grip tool to catch the pellicle frame at the recess portion or the cutout.

The number of recess portions or cutouts in the outer peripheral face of the pellicle frame may be one, or two or more. When plural recess portions are provided, the shapes of the respective recess portions may be the same as each other or different from each other (and the same applies to the case of cutouts).

Figure 5A:
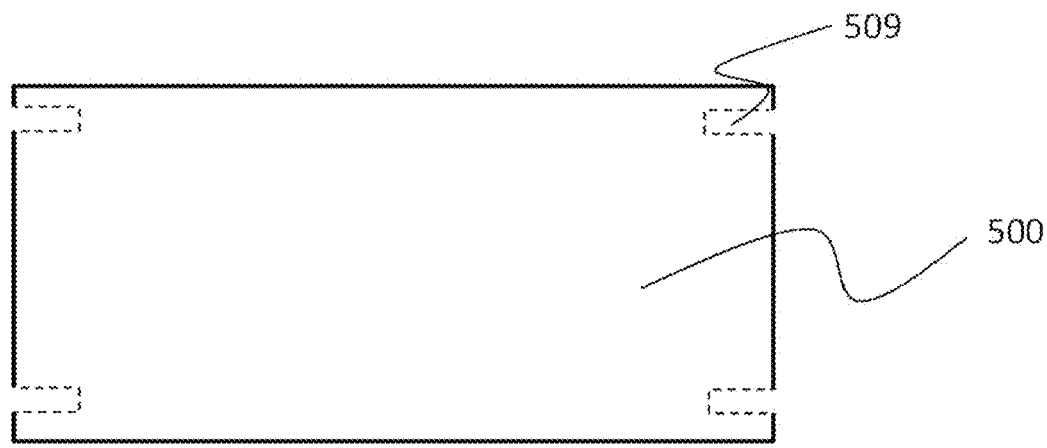
FIG. 5A is a schematic plan view illustrating one example of a stack that includes a pellicle frame according to an aspect in which a recess portion is provided on an outer peripheral face.
Figure 5B:
FIG. 5B is a schematic cross-sectional view illustrating one example of a stack that includes a pellicle frame according to an aspect in which a recess portion is provided on an outer peripheral face.

FIG. 5A is a schematic plan view illustrating one example of a stack that includes a pellicle frame according to an aspect in which a recess portion is provided on an outer peripheral face, and FIG. 5B is a schematic cross-sectional view illustrating this example.

As illustrated in FIGS. 5A and 5B, a stack according to this example includes a photomask 505, and a pellicle 501 that includes a pellicle frame 503 and a pellicle film 502. In this stack, the photomask 505, the pellicle frame 503, and the pellicle film 502 are disposed in this order. In the stack, a pressure-sensitive adhesive layer 500 is further formed on the pellicle film 502.

In the outer peripheral face of the pellicle frame 503, a recess portion 509 is provided in the vicinity of each of the four corners of the pellicle frame 503 in the plan view. Each recess portion 509 extends in parallel to the pellicle film 502 face, starting from the outer peripheral face of the pellicle frame.

In the stack in the present example, the pellicle frame 503 can easily be demounted from the photomask 505, for example, by inserting a grip tool for pellicle frame handling into the recess portion 509, or by allowing the grip tool to catch the pellicle frame at the recess portion 509.

Figure 5C:
FIG. 5C is a schematic cross-sectional view illustrating one example of a stack that includes a pellicle frame according to an aspect in which a cutout is provided on an outer peripheral face.

FIG. 5C is a variant modified from the stack shown in FIG. 5B, and is a schematic cross-sectional view illustrating one example of a stack that includes a pellicle frame according to an aspect in which a cutout is provided on an outer peripheral face.

The structure of the stack shown in FIG. 5C is the same as the structure of the stack shown in FIG. 5B, except that the recess portion 509 is replaced by a cutout 510.

In the stack according to this example, the pellicle frame 503 can easily be demounted from the photomask 505, for example, by inserting a grip tool for pellicle frame handling into the cutout 510, or by allowing the grip tool to catch the pellicle frame at the cutout 510.

Further, a through-hole penetrating through the pellicle frame from the outer peripheral face thereof to the inner peripheral face thereof may be provided at the pellicle frame. This through-hole functions as an air vent that allows gas communication between the exterior of the stack and the interior of the stack (i.e., the space enclosed by the inner peripheral face of the pellicle frame, the pellicle film, and the photomask).

A thorough hole penetrating through the pellicle frame in the thickness direction may be provided in the pellicle frame. This configuration makes it easy to demount the pellicle frame from the photomask. For example, the pellicle frame can easily be demounted from the photomask, for example, by inserting a grip tool for pellicle frame handling into the through-hole, or by allowing the grip tool to catch the pellicle frame at the through-hole.

A thorough hole penetrating through the pellicle film and the pellicle frame in the thickness direction may be provided in the stack. This configuration makes it easy to demount the pellicle film and the pellicle frame from the photomask. For example, the pellicle film and the pellicle frame can easily be demounted from the photomask, for example, by inserting a grip tool for pellicle frame handling into the through-hole, or by allowing the grip tool to catch the pellicle frame at the through-hole.

Figure 4A:
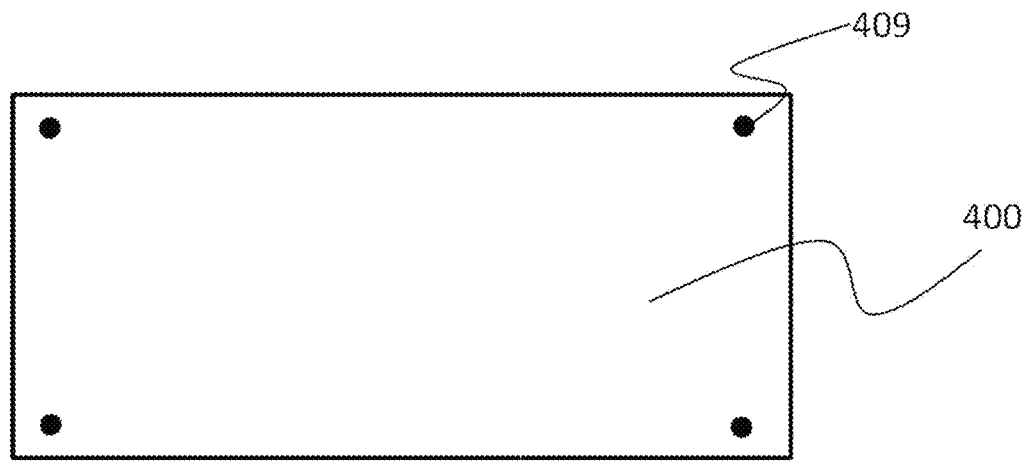
FIG. 4A is a schematic plan view illustrating one example of a stack according to an aspect in which a through-hole penetrating through a pellicle film and a pellicle frame in a thickness direction is provided.
Figure 4B:
FIG. 4B is a schematic cross-sectional view illustrating one example of a stack according to an aspect in which a through-hole penetrating through a pellicle film and a pellicle frame in a thickness direction is provided.

FIG. 4A is a schematic plan view illustrating one example of a stack according to an aspect in which a through-hole penetrating through a pellicle film and a pellicle frame in a thickness direction is provided, and FIG. 4B is a schematic cross-sectional view illustrating this example.

As illustrated in FIGS. 4A and 4B, the stack according to this example includes a photomask 405, and a pellicle 401 that includes a pellicle frame 403 and a pellicle film 402. In this stack, the photomask 405, the pellicle frame 403, and the pellicle film 402 are disposed in this order.

In this stack, a through-hole 409 that penetrates through the pellicle film 402 and the pellicle frame 403 in the thickness direction is provided. In the stack, a pressure-sensitive adhesive layer 400 is further formed on the pellicle film 402 (more specifically, in a region other than the through-hole 409).

Pellicle Film Adhesion Layer

The stack provided in the present step may further include a pellicle film adhesion layer disposed between the pellicle film and the pellicle frame.

The stack according to this aspect can be prepared, for example, by mounting a pellicle that includes the pellicle film, the pellicle film adhesion layer, and the pellicle frame on a photomask.

The term "pellicle film adhesion layer" refers to a layer that is disposed between the pellicle film and the pellicle frame and that is configured to adhere the pellicle film and the pellicle frame.

The pellicle film adhesion layer may include a known adhesive. Examples of an adhesive that can be contained in the pellicle film adhesion layer include acrylic resin adhesives, epoxy resin adhesives, silicone resin adhesives, fluorine-containing silicone-based adhesives, fluorine-containing ether-based adhesives, and the like.

Photomask

The stack provided in the present step includes a photomask. The photomask is not particularly limited as long as the photomask has a light irradiation face to be irradiated with light.

The photomask to be used may be a photomask that includes, for example, a support substrate, a reflective layer disposed on the support substrate, and an absorber layer formed on the reflective layer.

In the photomask, a face at a side at which the reflective layer and the absorber layer are provided serves as a light irradiation face. When the light irradiation face is irradiated with light such as EUV light, the absorber layer at the light irradiation face absorbs at least a part of the irradiated light, and the remainder of the light is reflected by the reflective layer. The reflected light is irradiated on a sensitive substrate (for example, a semiconductor substrate provided with a photoresist film). As a result, a desired image is formed on the sensitive substrate.

A preferable example of the reflective layer is a multilayer film of molybdenum (Mo) and silicon (Si). The absorber layer is preferably formed of a material having high absorbance with respect to the EUV light and the like, such as chromium (Cr) or tantalum nitride.

Mask Adhesion Layer

The stack provided in the present step may further include a mask adhesion layer disposed between the photomask and the pellicle frame.

The stack according to this aspect can be prepared, for example, by mounting, on a photomask, a pellicle including the pellicle film, the pellicle frame, and the mask adhesion layer that are arranged in this order, in an orientation such that the mask adhesion layer and the photomask contact each other.

The term "mask adhesion layer" refers to a layer that is disposed between the photomask and the pellicle frame and that is configured to adhere the photomask and the pellicle frame.

The mask adhesion layer may include a known adhesive. Examples of an adhesive that can be contained in the mask adhesion layer include double-sided pressure-sensitive adhesive tapes, silicone resin-based adhesives, acrylic adhesives, rubber-based adhesives, vinyl-based adhesives, epoxy-based adhesives, and the like.

The stack provided in the present step may include both of the mask adhesion layer and the pellicle film adhesion layer.

Figure 6:
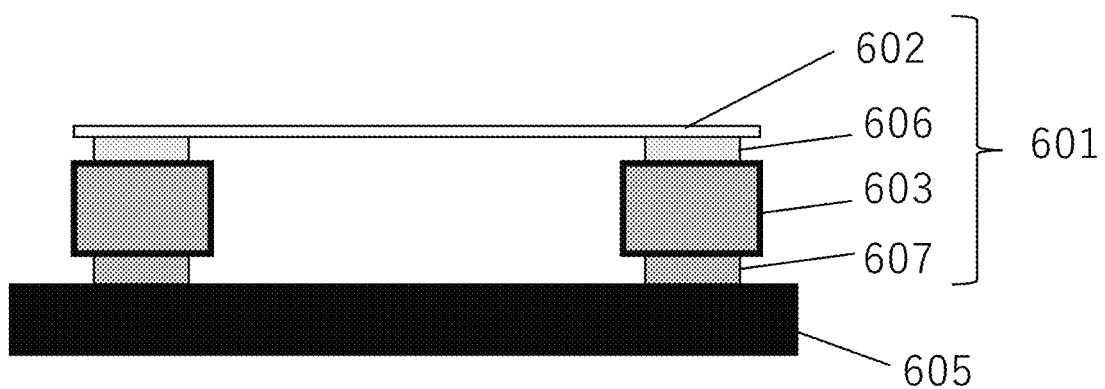
FIG. 6 is a schematic cross-sectional view schematically illustrating another example of a stack that is provided in a step of providing a stack in a pellicle demounting method according to the present disclosure.

FIG. 6 is a schematic cross-sectional view schematically illustrating another example (specifically, an example other than the example illustrated in FIG. 1) of the stack that is provided in the step of providing a stack in the pellicle demounting method according to the present disclosure.

As illustrated in FIG. 6, the stack according to this example includes a photomask 605, a mask adhesion layer 607, a pellicle frame 603, a pellicle film adhesion layer 606, and a pellicle film 602 that are arranged in this order. The stack according to the present example can be prepared using, for example, a pellicle 601 including the mask adhesion layer 607, the pellicle frame 603, the pellicle film adhesion layer 606, and the pellicle film 602 that are arranged in this order.

Figure 7:
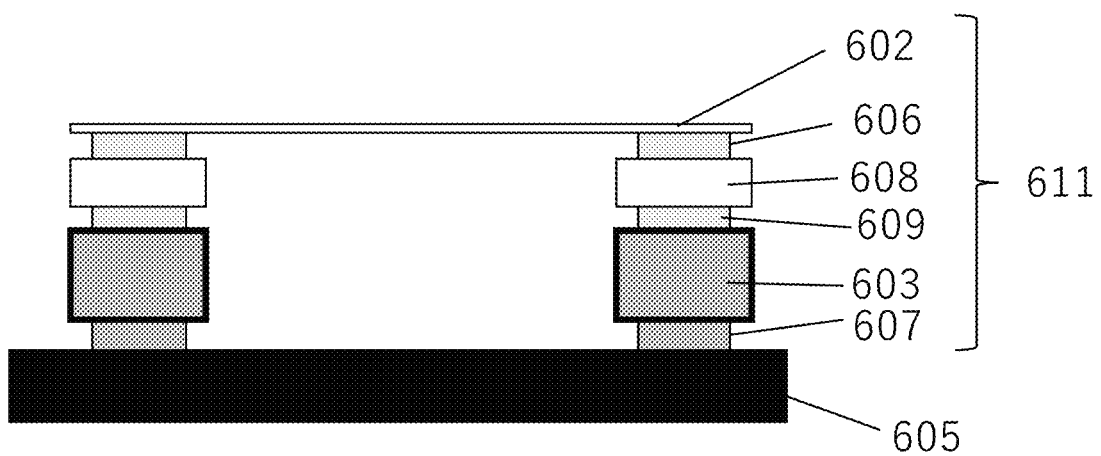
FIG. 7 is a schematic cross-sectional view schematically illustrating still another example of a stack that is provided in a step of providing a stack in a pellicle demounting method according to the present disclosure.

FIG. 7 is a schematic cross-sectional view schematically illustrating still another example of the stack that is provided in the step of providing a stack in the pellicle demounting method according to the present disclosure.

The stack according to the example illustrated in FIG. 7 has the same configuration as that of the stack according to the example illustrated in FIG. 6, except that a pellicle support frame 608 and a support frame adhesion layer 609 are disposed between the pellicle film adhesion layer 606 and the pellicle frame 603 (here, the pellicle film support frame 608 contacts the pellicle film adhesion layer 606, and the support frame adhesion layer 609 contacts the pellicle frame 603).

The stack in the present example can be prepared using, for example, a pellicle 611 including the mask adhesion layer 607, the pellicle frame 603, the support frame adhesion layer 609, the pellicle film support frame 608, the pellicle film adhesion layer 606, and the pellicle film 602 that are arranged in this order.

Figure 8:
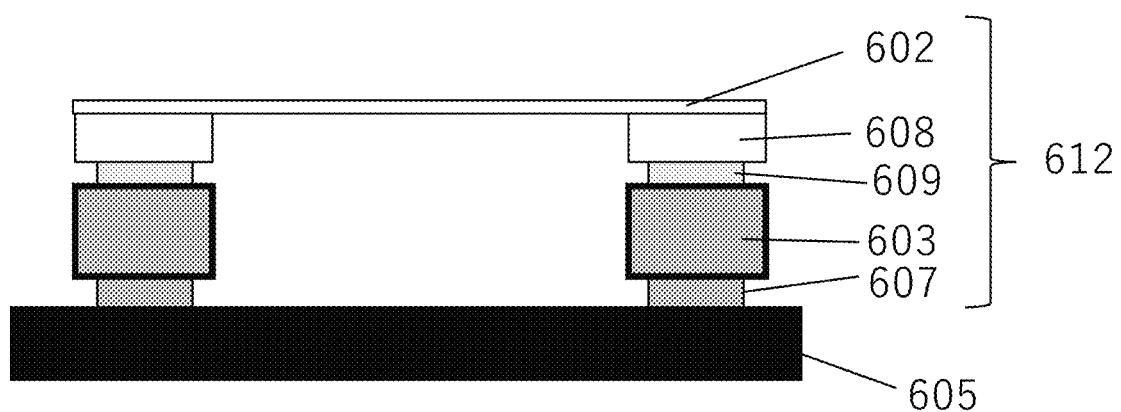
FIG. 8 is a schematic cross-sectional view schematically illustrating still another example of a stack that is provided in a step of providing a stack in a pellicle demounting method according to the present disclosure.

FIG. 8 is a schematic cross-sectional view schematically illustrating still another example of the stack that is provided in the step of providing a stack in the pellicle demounting method according to the present disclosure.

The configuration of the stack according to the example illustrated in FIG. 8 is the same as that of the stack according to the example illustrated in FIG. 7, except that the pellicle film adhesion layer 606 is not present.

The stack in the present example can be prepared using, for example, a pellicle 612 that including the mask adhesion layer 607, the pellicle frame 603, the support frame adhesion layer 609, the pellicle film support frame 608, and the pellicle film 602 that are arranged in this order.

As illustrated in FIGS. 6 to 8, the scope of the pellicle according to the present disclosure encompasses not only an aspect (see FIG. 1) in which a pellicle film is directly supported at one thickness-direction end face side of a pellicle frame (i.e., without another element disposed therebetween), but also aspects (see FIGS. 6 to 8) in which a pellicle film is supported at one thickness-direction end face side of a pellicle frame with one or more other elements (for example, a pellicle film adhesion layer, a pellicle film support frame, a support frame adhesion layer, or the like) disposed therebetween.

Step of Forming Pressure-Sensitive Adhesive Layer

The step of forming a pressure-sensitive adhesive layer is a step of forming a pressure-sensitive adhesive layer on the pellicle film in the stack described above. The step of forming a pressure-sensitive adhesive layer is preferably a step of forming a pressure-sensitive adhesive layer using a spray coating method, a spin coating method, an inkjet method, a screen printing method, or a dip coating method, more preferably a step of forming a pressure-sensitive adhesive layer using a spray coating method or a spin coating method, and particularly preferably a step of forming a pressure-sensitive adhesive layer using a spray coating method, from the viewpoint of further reducing the load applied to the pellicle film during the forming of a pressure-sensitive adhesive layer.

Forming a pressure-sensitive adhesive layer using a spray coating method may be performed using a known spray coating apparatus. Examples of the spray coating apparatus include spray guns, ultrasonic spray coating apparatuses, two-fluid spray coating apparatuses, one-fluid spray coating apparatuses, and the like.

The pressure-sensitive adhesive layer preferably includes at least one pressure-sensitive adhesive. From the viewpoint of reduction of photomask contamination, the pressure-sensitive adhesive layer preferably includes at least one pressure-sensitive adhesive selected from the group consisting of a silicone-based pressure-sensitive adhesive, an acrylic pressure-sensitive adhesive, a urethane-based pressure-sensitive adhesive, a polyamide-based pressure-sensitive adhesive, a polyester-based pressure-sensitive adhesive, an ethylene-vinyl acetate copolymer, an olefin-based pressure-sensitive adhesive, a polybutadiene-based pressure-sensitive adhesive, a rubber-based pressure-sensitive adhesive, and a styrene-based pressure-sensitive adhesive, and more preferably includes at least one pressure-sensitive adhesive selected from the group consisting of an acrylic pressure-sensitive adhesive, a polybutadiene-based pressure-sensitive adhesive, and a rubber-based pressure-sensitive adhesive. The pressure-sensitive adhesive may be used singly or in combination of two or more thereof.

The silicone-based pressure-sensitive adhesive is preferably a pressure-sensitive adhesive that includes a silicone resin as a main component. The silicone-based pressure-sensitive adhesive is not particularly limited, and examples thereof include addition-reaction silicone-based pressure-sensitive adhesives, peroxide-curing silicone-based pressure-sensitive adhesives, and condensation silicone-based pressure-sensitive adhesives.

Among them, addition-curing silicone-based pressure-sensitive adhesives, having a high holding power, are preferable from the viewpoint of holding the pellicle film by the pressure-sensitive adhesive.

In the present disclosure, the main component of the pressure-sensitive adhesive means a component that accounts for at least 50% by mass of the total mass of the pressure-sensitive adhesive.

The acrylic pressure-sensitive adhesive is preferably a pressure-sensitive adhesive that includes an acrylic resin as a main component. The acrylic resin contained in the acrylic pressure-sensitive adhesive is not particularly limited, and examples thereof include alkyl (meth)acrylate pressure-sensitive adhesives, urethane (meth)acrylate, and epoxy (meth)acrylate.

The acrylic pressure-sensitive adhesive may be a pressure-sensitive adhesive that includes an acrylic rubber resin as a main component. The acrylic rubber resin is, for example, a block copolymer of methyl methacrylate and butyl acrylate.

The urethane-based pressure-sensitive adhesive is preferably a pressure-sensitive adhesive that includes a polyurethane resin as a main component. The polyurethane contained in the urethane-based pressure-sensitive adhesive is not particularly limited, and examples thereof include polyester polyurethanes, polycarbonate polyurethanes, and the like.

The polyamide-based pressure-sensitive adhesive is preferably a pressure-sensitive adhesive that includes a polyamide resin as a main component. The polyamide resin contained in the polyamide-based pressure-sensitive adhesive is not particularly limited, and examples thereof include a polyamide (Amide 11) that is a ring-opening polycondensate of undecanelactam, a polyamide (Amide 12) that is a ring-opening polycondensate of lauryllactam, and the like.

The polyester-based pressure-sensitive adhesive is preferably a pressure-sensitive adhesive that includes a polyester resin as a main component. The polyester resin is not particularly limited, and examples thereof include a condensation polymerization product of a polycarboxylic acid and a polyhydric alcohol.

Specific examples of the polyester include polyethylene terephthalate, polybutylene terephthalate, and the like.

The olefin-based pressure-sensitive adhesive is preferably a pressure-sensitive adhesive that includes an olefin resin as a main component. The olefin is not particularly limited, and may be a polymer that is a homopolymer of an olefin, or a copolymer obtained by polymerizing an olefin and one or more other monomers. The olefin is preferably an olefin having 2 to 6 carbon atoms, and examples thereof include ethylene, propylene, butene, methylpentene, and hexene. Examples of the other monomers for use in the copolymer include vinyl acetate.

The rubber-based pressure-sensitive adhesive is preferably a pressure-sensitive adhesive that includes rubber as a main component, and examples thereof include natural rubber-based pressure-sensitive adhesives and synthetic rubber-based pressure-sensitive adhesives as favorable examples. Examples of the synthetic rubber-based pressure-sensitive adhesives include styrene-butadiene copolymers (SBR, SBS), styrene-isoprene copolymers (SIS), acrylonitrile-butadiene copolymers (NBR), chloroprene copolymers, isobutylene-isoprene copolymers (butyl rubber), and the like.

Among them, from the viewpoints of ease of forming of a pressure-sensitive adhesive layer and ease of holding the pellicle film, the rubber-based pressure-sensitive adhesive is preferably a synthetic rubber-based pressure-sensitive adhesive, and more preferably a pressure-sensitive adhesive that includes a styrene-butadiene copolymer as a main component.

The polybutadiene-based pressure-sensitive adhesive is preferably a pressure-sensitive adhesive that is other than the rubber-based pressure-sensitive adhesive described above, and that includes a polybutadiene as a main component. The polybutadiene is not particularly limited as long as the polybutadiene includes a structural unit formed from butadiene, and the polybutadiene may be a homopolymer or a copolymer with one or more other monomers than butadiene.

The styrene-based pressure-sensitive adhesive is a pressure-sensitive adhesive that is other than the rubber-based pressure-sensitive adhesive described above, and that includes a polystyrene resin as a main component. The polystyrene resin is not particularly limited, and examples thereof include a homopolymer of a styrene-based monomer (such as styrene, methylstyrene, ethylstyrene, isopropylstyrene, dimethylstyrene, paramethylstyrene, chlorostyrene, bromostyrene, vinyltoluene, or vinylxylene), and a copolymer of a styrene-based monomer and one or more monomers that can copolymerize with the styrene-based monomer.

Examples of the monomers that can copolymerize with the styrene-based monomer include a vinyl monomer (such as acrylonitrile, methacrylonitrile, acrylic acid, methacrylic acid, methyl methacrylate, maleic anhydride, or butadiene).

From the viewpoint of the capability to reduce photomask contamination, the glass transition temperature of the pressure-sensitive adhesive is preferably from −60° C. to −20° C., and more preferably from −60° C. to −40° C.

From the viewpoint of the capability to reduce photomask contamination, the weight average molecular weight of the base polymer of the pressure-sensitive adhesive is preferably from 10,000 to 1,500,000, and more preferably from 50,000 to 1,000,000. It is also workable to mix base polymers having different weight average molecular weights.

The amount of the pressure-sensitive adhesive applied when the pressure-sensitive adhesive layer is formed by applying the pressure-sensitive adhesive onto the pellicle film (for example, the coating amount in the case of coating the pressure-sensitive adhesive using a spray coating method) is preferably from 1 $g/m^2$ to 1,000 $g/m^2$, and more preferably from 50 $g/m^2$ to 1,000 $g/m^2$, in terms of application amount after drying.

The pressure-sensitive adhesive layer may be formed by applying, onto the pellicle film, a pressure-sensitive adhesive solution containing a pressure-sensitive adhesive and a solvent. Known solvents may be used as the solvent in the pressure-sensitive adhesive solution.

Examples of the solvent in the pressure-sensitive adhesive solution include acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methxy-1-propanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, ethyl lactate, and the like.

In the pressure-sensitive adhesive solution, only one solvent may be present, or two or more solvents may be present.

The solid concentration of the pressure-sensitive adhesive solution (i.e., the content of the pressure-sensitive adhesive with respect to the total amount of the pressure-sensitive adhesive solution) is preferably approximately from 1% by mass to 50% by mass.

The viscosity (at 25° C.) of the pressure-sensitive adhesive solution is preferably from 1 mPa·s to 1,000 mPa·s, and more preferably from 100 mPa·s to 800 mPa·s, from the viewpoint of further improving the tightness of the adhesion between the pellicle film and the pressure-sensitive adhesive.

The viscosity of the pressure-sensitive adhesive solution can be adjusted, as appropriate, based the type and/or amount of the solvent.

The thickness of the pressure-sensitive adhesive layer is more preferably from 1 μm to 1 mm, and still more preferably from 50 μm to 1 mm. The thickness of the pressure-sensitive adhesive layer can be adjusted using known methods.

For example, in a case in which the pressure-sensitive adhesive layer is formed using a spray coating method, the thickness of the pressure-sensitive adhesive layer can be adjusted by adjusting the discharge amount of the pressure-sensitive adhesive solution discharged from a spray coating apparatus (such as a spray gun).

The thickness of the pressure-sensitive adhesive layer can be obtained by cutting the stack in the vertical direction and observing the resultant cross-section using a scanning electron microscope.

The pressure-sensitive adhesive layer may have lattice-structured grooves. For example, when the protective film described below is overlaid on the pressure-sensitive adhesive layer, the lattice-structured grooves provided on the pressure-sensitive adhesive layer prevents rupture of the pellicle film by facilitating discharge of the air, which has been trapped between the pellicle film and the protective film upon adhering together the pellicle film and the protective film, to the exterior space via the lattice structure.

The apparatus for carrying out the step of forming a pressure-sensitive adhesive layer (for example, the pellicle pre-demounting processing device described below) may include a cover for preventing the pressure-sensitive adhesive discharged toward the pellicle film from being deposited on a portion other than the pellicle film.

Demounting Step

The demounting step is a step of demounting at least the pellicle film and the pressure-sensitive adhesive layer from the photomask in the stack having the pressure-sensitive adhesive layer formed thereon. The method used for demounting the pellicle film and the pressure-sensitive adhesive layer is not particularly limited. The demounting may be carried out using a gripping tool or may be carried out using the protective film described below.

In the demounting step, it is acceptable for the pellicle film to be broken during demounting of the pellicle film. Even when the pellicle film is broken, pellicle film pieces generated by the breakage are trapped by being adhered to the pressure-sensitive adhesive layer, and, therefore, scattering of the pellicle pieces is reduced, which, in turn, reduces contamination of the photomask caused by scattering of the pellicle film pieces.

In the demounting step, the pellicle frame, the pellicle film, and the pressure-sensitive adhesive layer may be demounted from the photomask in the stack having the pressure-sensitive adhesive layer formed thereon, or the pellicle film and the pressure-sensitive adhesive layer may be demounted while leaving the pellicle frame at the photomask-side part.

In a case in which the pellicle frame, the pellicle film, and the pressure-sensitive adhesive layer are demounted in the demounting step from the photomask in the stack having the pressure-sensitive adhesive formed thereon, the pellicle frame, the pellicle film, and the pressure-sensitive adhesive layer may be demounted together at once, or, alternatively, the pellicle film and the pressure-sensitive adhesive layer may be demounted first while leaving the pellicle frame at the photomask-side part, followed by demounting of the pellicle film.

Heat Treatment During Demounting Step

When the stack further includes a mask adhesion layer between the photomask and the pellicle frame, and this stack (i.e., a stack including the photomask, the mask adhesion layer, the pellicle frame, and the pellicle film that are arranged in this order) is designated as a first stack, the demounting step may include:

demounting the pellicle film and the pressure-sensitive adhesive layer while leaving the pellicle frame at the photomask-side part of the first stack having the pressure-sensitive adhesive layer formed thereon, to obtain a second stack that includes the photomask, the mask adhesion layer, and the pellicle frame;

heat-treating the second stack; and demounting the pellicle frame from the photomask in the second stack.

In the present aspect, the adhesion power exerted by the mask adhesion layer can be reduced by heat-treating the second stack, and, therefore, the demounting of the pellicle frame can more easily be carried out.

In the heat treatment, the entire second stack may be heat-treated, or a part of the second stack (for example, a part including the adhesion layer) may be heat-treated. The apparatus used for the heat treatment is not particularly limited, and a heater, a hot plate, an oven, or the like may be used.

The temperature of the heat treatment is, for example, from 50° C. to 140° C. The duration of the heat treatment is, for example, 10 seconds to 300 seconds.

Step of Adhering Protective Film in Pressure-Sensitive Manner

The pellicle demounting method according to one embodiment of the present disclosure may further include a step of adhering, in a pressure-sensitive manner, a protective film onto the pressure-sensitive adhesive layer in the stack having the pressure-sensitive adhesive layer formed thereon, after the step of forming the pressure-sensitive adhesive layer but before the demounting step.

In this case, the demounting step is preferably a step of demounting at least the protective film, the pressure-sensitive adhesive layer, and the pellicle film from the photomask in the stack having the protective film adhered thereto. The demounting step according to this aspect is more preferably a step of demounting the protective film, the pressure-sensitive adhesive layer, the pellicle film, and the pellicle frame at once, or a step of demounting the protective film, the pressure-sensitive adhesive layer, and the pellicle film first, and then demounting the pellicle frame.

When the pellicle demounting method includes a step of adhering a protective film in a pressure-sensitive manner, pellicle film pieces, even if generated by breakage of a pellicle film, will be trapped by the pressure-sensitive adhesive layer, and retained on the protective film with the pressure-sensitive adhesive layer therebetween. As a result, scattering of the pellicle film pieces and contamination of the photomask caused by scattering of the pellicle film pieces are more strongly reduced.

In the present step, the expression, "adhering, in a pressure-sensitive manner, a protective film onto the pressure-sensitive adhesive layer in the stack having the pressure-sensitive adhesive layer formed thereon", means allowing the pressure-sensitive adhesive layer in the stack having the pressure-sensitive adhesive layer formed thereon and the protective film to adhere to each other in a pressure-sensitive manner. This may be performed by pressing the protective film against the pressure-sensitive adhesive layer to cause adhesion between the pressure-sensitive adhesive layer and the protective film, or by pressing the pressure-sensitive adhesive layer against the protective film to cause adhesion between the pressure-sensitive adhesive layer and the protective film, or by pressing the pressure-sensitive adhesive layer and the protective film against each other to cause adhesion between the pressure-sensitive adhesive layer and the protective film.

The protective film is not particularly limited, and favorable examples thereof include a polyethylene terephthalate (PET) film, a polypropylene (PP) film, and a polycarbonate (PC) film.

The protective film is preferably a transparent or semi-transparent protective film since the transparency or semi-transparency of the protective film makes it easier to carry out adhesion while observing the presence or absence of air bubbles between the pressure-sensitive adhesive layer and the pellicle film. However, the protective film is not limited to a transparent or semi-transparent protective film.

The thickness of the protective film is not particularly limited. From the viewpoint of providing an adequate strength, the thickness of the protective film is preferably from 50 µm to 500 µm, and more preferably from 100 µm to 200 µm.

The protective film may have a lattice-shaped recess structure from the viewpoint of facilitating discharge of any air incorporated during adhering of the protective film to the pressure-sensitive adhesive to the exterior space.

The step of adhering a protective film in a pressure-sensitive manner may be a step including providing a protective-film-attached substrate that includes a protective layer and substrate, and adhering, in a pressure-sensitive manner, the protective film in the protective-film-attached substrate onto the pressure-sensitive adhesive layer in the stack having the pressure-sensitive adhesive layer formed thereon.

The substrate in the protective-film-attached substrate is, for example, a glass substrate, a metal substrate, a plastic substrate, or the like.

In the step of adhering the protective film in a pressure-sensitive manner, the method used for adhering the protective film onto the pressure-sensitive adhesive layer is not particularly limited, and examples of the method include:
- a method of applying an external force to the protective film to cause the pressure-sensitive adhesion;
- a method of bringing about the pressure-sensitive adhesion by an attraction force such as self-weight, intermolecular force, or electrostatic force without applying an external force to the protective film;
- a method of disposing the protective film and the pressure-sensitive adhesive layer close to each other in a reduced-pressure environment, to cause the pressure-sensitive adhesion; and
- a method of supplying air into the space enclosed by the pellicle film, the inner peripheral face of the pellicle frame, and the photomask in the stack to allow the space to have a positive pressure, thereby expanding the pellicle film having the pressure-sensitive adhesive layer thereon in the direction toward the protective film to cause the pressure-sensitive adhesion.

In the case of expanding the pellicle film having the pressure-sensitive adhesive layer thereon in the direction toward the protective film to cause the pressure-sensitive adhesion, the pellicle film may be intentionally broken by expanding the pellicle film having the pressure-sensitive adhesive layer thereon. Even in a case in which the pellicle film is intentionally broken, pellicle film pieces generated by the breakage are trapped by the pressure-sensitive adhesive layer, and retained on the protective film with the pressure-sensitive adhesive layer disposed therebetween. As a result, scattering of the pellicle pieces and contamination of the photomask caused by scattering of the pellicle film pieces are more strongly reduced.

In a case in which the protective film is adhered, in a pressure-sensitive manner, onto the pressure-sensitive adhesive layer in the stack in which a through-hole penetrating through the pressure-sensitive adhesive layer, the pellicle film, and the pellicle frame in the thickness direction is provided (for example, the above-discussed stack illustrated in FIGS. 4A and 4B), a through-hole penetrating through the protective film may be provided at a position in the protective film that overlaps the aforementioned through-hole. The provision of the through-hole results in formation of a through-hole (hereinafter also referred to as "through-hole X") penetrating through the protective film, the pressure-sensitive adhesive layer, the pellicle film, and the pellicle frame in the stack having the protective film adhered thereto. The protective film, the pressure-sensitive adhesive layer, the pellicle film, and the pellicle frame of the stack having the protective film adhered thereto can easily be demounted by inserting a grip tool into the through-hole X or by allowing the grip tool to catch the film or layer or frame at the through-hole X.

Step of Heat-Treating Stack

The pellicle demounting method according to the present disclosure may further include a step of heat-treating the stack (i.e., a stack including a photomask, a pellicle frame, and a pellicle film) before the demounting step (more preferably, in the step of providing a stack but before the step of forming a pressure-sensitive adhesive layer).

The aspect including the step of heat-treating the stack is particularly effective in a case in which the stack includes at least one of the pellicle film adhesion layer or the mask adhesion layer. In this case, heat-treating the stack can decrease the adhesion power exerted by at least one of the pellicle film adhesion layer or the mask adhesion layer, as a result of which demounting can more easily be carried out while reducing breakage of the pellicle film.

In the heat treatment, the entire stack may be heat-treated, or a part of the stack (for example, a part including at least one of the pellicle film adhesion layer or the mask adhesion layer) may be heat-treated.

The apparatus used for the heat treatment is not particularly limited, and a heater, a hot plate, an oven, or the like may be used. The temperature of the heat treatment is, for example, from 50° C. to 140° C. The duration of the heat treatment is, for example, from 10 seconds to 300 seconds.

The pellicle demounting method according to the present disclosure may include another process than the aforementioned processes, if necessary.

Embodiments 1 to 3, which are specific embodiments of the pellicle demounting method according to the present disclosure, are described below. However, the pellicle demounting method according to the present disclosure is not limited to the following embodiments.

Embodiment 1

Embodiment 1 is described below with reference to FIG. 6. Explanation regarding FIG. 6 is as described above.

In Embodiment 1, a stack having the same configuration as that of the stack shown in FIG. 6 is provided in the step of providing a stack, and the step of forming a pressure-sensitive adhesive layer is carried out on the provided stack to form a pressure-sensitive adhesive layer on the pellicle film 602, thereby obtaining a pressure-sensitive adhesive layer-attached stack (not shown).

Thereafter, the step of heat-treating the pressure-sensitive adhesive layer-attached stack is carried out (not shown). As a result, the adhesion power exerted by the mask adhesion layer and the adhesion power exerted by the pellicle film adhesion layer are reduced in the stack.

Subsequently, in the demounting step, the pressure-sensitive adhesive layer (not shown) and the pellicle film 602 of the pressure-sensitive adhesive layer-attached stack are demounted after the heat treatment, and then the mask adhesion layer 607, the pellicle frame 603, and the pellicle film adhesion layer 606 are demounted.

In Embodiment 1, the step of forming a pressure-sensitive adhesive layer, and the step of heat-treating the stack may be an order that is opposite to the aforementioned order.

Embodiment 2

Embodiment 2 is the same as Embodiment 1, except for the following points. Embodiment 2 further includes a step of adhering, in a pressure-sensitive manner, a protective film onto the pressure-sensitive adhesive layer in the pressure-sensitive adhesive layer-attached stack, after the step of forming a pressure-sensitive adhesive layer but before the demounting step.

In the demounting step in Embodiment 2, the protective film, the pressure-sensitive adhesive layer, and the pellicle film are demounted first from the photomask in the stack having the protective film adhered thereto, and then the mask adhesion layer, the pellicle frame, and the pellicle film adhesion layer are demounted.

In Embodiment 2, the step of heat-treating the stack may be omitted.

Embodiment 3

Embodiment 3 is the same as Embodiment 1, except for the following points. In Embodiment 3, the step of heat-treating the stack is not carried out, but the after-mentioned heat treatment during the demounting step is carried out instead.

Embodiment 3 further includes a step of adhering, in a pressure-sensitive manner, a protective film onto the pressure-sensitive adhesive layer in a pressure-sensitive adhesive layer-attached first stack (i.e., a stack in which a pressure-sensitive adhesive layer is formed on a pellicle film of the first stack including a photomask, a mask adhesion layer, a pellicle frame, and the pellicle film that are arranged in this order), after the step of forming a pressure-sensitive adhesive layer but before the demounting step.

In the demounting step in Embodiment 3, first, the protective film, the pressure-sensitive adhesive layer, and the pellicle film are demounted from the photomask in the first stack having the protective layer adhered thereto to obtain a second stack that includes the photomask, the mask adhesion layer, the pellicle frame, and the pellicle film adhesion layer, and then the aforementioned heat treatment during the demounting step is carried out (i.e., heat treatment on the second stack is carried out), and then the mask adhesion layer, the pellicle frame, and the pellicle film adhesion layer are demounted from the photomask in the second stack.

Pellicle Pre-Demounting Processing Device

Next, an embodiment of a pellicle pre-demounting processing device that is suitable for carrying out the step of forming a pressure-sensitive adhesive layer in the above-described pellicle demounting method according to the present disclosure will be described.

Here, the term "pellicle pre-demounting processing" means an operation to form a pressure-sensitive adhesive layer in the pellicle demounting method according to the present disclosure, and the term "pellicle pre-demounting processing device" means a device for performing the pellicle pre-demounting processing as defined above.

The pellicle pre-demounting processing device according to the present embodiment includes:
 a stage unit configured such that the stack in the pellicle demounting method according to the present disclosure (i.e., a stack including a photomask, a pellicle frame, and a pellicle film that are arranged in this order) is placed with the pellicle film located at the upper side and the photomask located at the lower side; and
 a discharge unit configured to discharge a pressure-sensitive adhesive solution onto the pellicle film in the stack placed on the stage unit.

The step of forming a pressure-sensitive adhesive layer in the pellicle demounting method according to the present disclosure can be performed using the pellicle pre-demounting processing device according to the present embodiment. More specifically, a pressure-sensitive adhesive layer can be formed by discharging and applying a pressure-sensitive adhesive solution onto a pellicle film.

Thus, according to the pellicle pre-demounting processing device according to the present embodiment, an effect with respect to reduction of photomask contamination caused by pellicle film pieces is exerted, as with the pellicle demounting method according to the present disclosure.

In the pellicle pre-demounting processing device according to the present embodiment, a pressure-sensitive adhesive layer is formed by applying, by discharging, a pressure-sensitive adhesive solution onto a pellicle film in a stack disposed in an orientation such that the pellicle film is located at the upper side and such that a photomask is located at the lower side. Due to this configuration, unevenness in the pressure-sensitive adhesive layer caused by dripping or the like is reduced. From the viewpoint of more effectively obtaining this effect, it is preferable that the stack is placed on the stage unit with the film face of the pellicle film located horizontally.

The pellicle pre-demounting processing device according to the present embodiment may also include one or more other elements, if necessary. Examples of the other elements include a cover for preventing scattering of a pressure-sensitive adhesive solution.

For example, a cover having a shape configured to cover a part of the pellicle film located above the pellicle frame but expose the self-standing portion of the pellicle film can be used as the cover for preventing scattering of a pressure-sensitive adhesive solution. A cover having the above-specified shape enables a pressure-sensitive adhesive layer to be formed on the self-standing portion of the pellicle film while preventing scattering of the pressure-sensitive adhesive solution.

Examples of the other elements also include a pellicle demounting member (for example, a grip, lever, or the like for handling the pellicle frame). In this case, both of the pellicle pre-demounting processing (i.e., forming of a pressure-sensitive adhesive layer) and demounting of the pellicle can be carried out by the pellicle pre-demounting processing device according to the present embodiment.

Two specific examples of the pellicle pre-demounting processing device according to the present embodiment are described below. However, the pellicle pre-demounting processing device according to the present embodiment is not limited to the following two examples.

Figure 9:
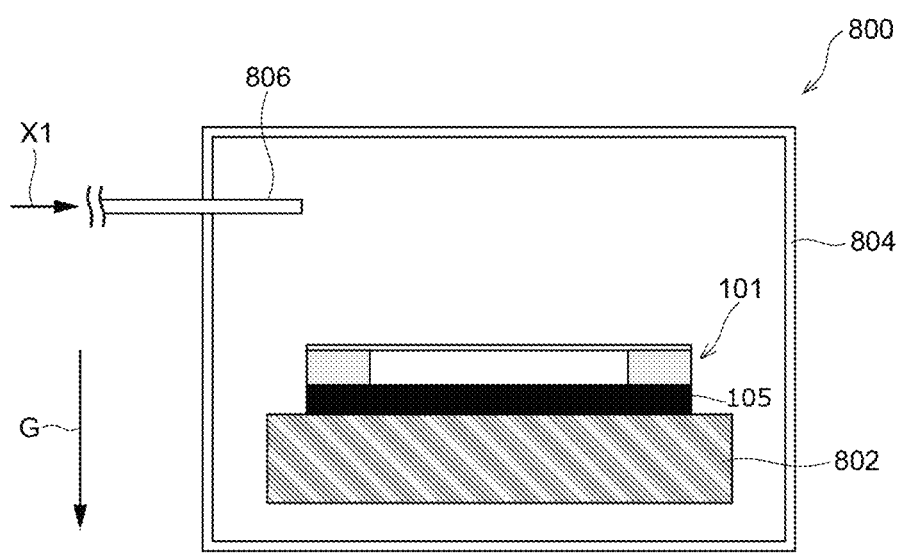
FIG. 9 is a schematic cross-sectional view schematically illustrating one example of a pellicle pre-demounting processing device according to an embodiment of the present disclosure.

FIG. 9 is a schematic cross-sectional view schematically illustrating one example of a pellicle pre-demounting processing device according to an embodiment of the present disclosure. More specifically, the examples illustrated in FIG. 9 is an example of a device that forms a pressure-sensitive adhesive layer by applying a pressure-sensitive adhesive solution using a spray coating method.

As illustrated in FIG. 9, a pellicle pre-demounting processing device 800 according to the present example includes, in a chamber 804:

- a stage unit 802 configured such that the stack 101 (see FIG. 1) is placed in an orientation such that the pellicle film is located at the upper side (i.e., the upstream side in the direction G of gravitational force) and the photomask is located at the lower side (i.e., the downstream side in the direction G of gravitational force); and
- a spray nozzle 806 (a discharge unit using a spray method) configured to discharge a pressure-sensitive adhesive solution onto the pellicle film in the stack placed on the stage unit.

The stage unit 802 may have a fixing function for fixing the stack (for example, a vacuum chuck).

In the present example, a pressure-sensitive adhesive solution is supplied, in the direction indicated by an arrow X1, from a pressure-sensitive adhesive source (not shown) disposed outside of the chamber 804, and the pressure-sensitive adhesive solution is discharged using a spray method from a discharge port of the spray nozzle 806 extending into the chamber 804. The discharged pressure-sensitive adhesive solution is applied onto the pellicle film in the stack placed on the stage unit 802 (spray coating), whereby a pressure-sensitive adhesive layer is formed on the pellicle film.

In this example, the direction of discharge of the pressure-sensitive adhesive solution from the spray nozzle 806 is a horizontal direction. When the discharge direction is a horizontal direction or a direction that is inclined upward from a horizontal direction, damages to the pellicle film caused by discharge of the pressure-sensitive adhesive solution is more strongly reduced.

Figure 10:
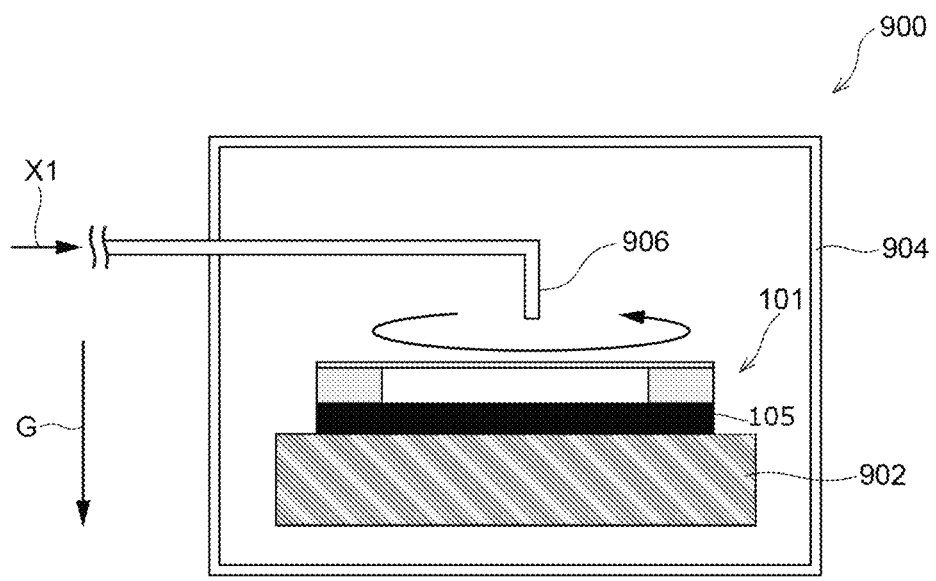
FIG. 10 is a schematic cross-sectional view schematically illustrating another example of a pellicle pre-demounting processing device according to an embodiment of the present disclosure.

FIG. 10 is a schematic cross-sectional view schematically illustrating another example of a pellicle pre-demounting processing device according to the present embodiment.

Specifically, the example illustrated in FIG. 10 is an example of a device that forms a pressure-sensitive adhesive layer by applying a pressure-sensitive adhesive solution using a spin coating method.

As illustrated in FIG. 10, a pellicle pre-demounting processing device 900 according to the present example includes, in a chamber 904:

- a stage unit 902 configured such that the stack 101 (see FIG. 1) is placed in an orientation such that the pellicle film is located at the upper side (i.e., the upstream side in the direction G of gravitational force) and the photomask is located at the lower side (i.e., the downstream side in the direction G of gravitational force); and
- a discharge unit 906 configured to discharge a pressure-sensitive adhesive solution onto the pellicle film in the stack placed on the stage unit.

The stage unit 902 may have a fixing function for fixing the stack (for example, a vacuum chuck).

In the present example, the stage unit 902 has a rotation function. Rotation of the stack in a plane horizontal to the film face of the pellicle film based on the rotation function causes the pressure-sensitive adhesive solution discharged to the pellicle film to be coated on the pellicle film (spin coating).

The direction of discharge from the discharge unit 906 in the present example is a downward-inclined direction. The discharge position of the discharge unit 906 is at or around the center of the pellicle film. However, the discharge direction and discharge position of the discharge unit 906 are not limited to the present example.

EXAMPLES

Examples according to the present disclosure are described below. However, the present disclosure is not limited to the following examples.

Example 1

Demounting of a pellicle was performed by carrying out the following steps. Specifics thereof are described below.

Step of Providing Stack

A pellicle was provided which included:

a SiN pellicle film;

a pellicle frame that supports the SiN pellicle film at one end face side of the pellicle frame;

a pellicle film adhesion layer that is disposed between the SiN pellicle film and the pellicle frame; and a mask adhesion layer that is provided on an end face of the pellicle frame at the opposite side from the end face that supports the SiN pellicle film.

Handling holes that are recess portions are provided on the outer peripheral face of the pellicle film. The handling holes serve as a point of load for demounting with a lever. Through-holes for air vent that penetrate from the outer peripheral face to the inner peripheral face are also provided at the pellicle frame.

The pellicle was pressed against the light shielding film layer side of a photomask that includes the light shielding film layer, at a load of 98 N for 30 seconds in an orientation that allows the light shielding film layer side of the photomask and the mask adhesion layer of the pellicle to contact each other. The pellicle was thereby mounted on the photomask, to obtain a stack.

Step of Forming Pressure-Sensitive Adhesive Layer

A rubber-based pressure-sensitive adhesive solution (product name: 3M spray glue 77, manufactured by 3M), which included styrene-butadiene rubber as a main component, was spray-coated on the self-standing portion (i.e., a portion above the opening area enclosed by the inner peripheral face of the pellicle frame) of the pellicle film in the stack, to form a pressure-sensitive adhesive layer having a thickness of about 100 μm, thereby obtaining the pressure-sensitive adhesive layer-attached stack.

During the forming of a pressure-sensitive adhesive layer, the portion of the pellicle film other than the self-standing portion was masked by a PET film having an opening in a size that was substantially the same as that of the self-standing portion of the pellicle film, in order to prevent the pressure-sensitive adhesive from adhering to the portion of the pellicle film other than the self-standing portion. After the pressure-sensitive adhesive layer was formed, the PET film for masking was removed.

Step of Adhering Protective Film in Pressure-Sensitive Manner

A 100 μm-thick transparent PET film as a protective film was laid on and fixed to a glass plate, thereby providing a PET film-attached glass plate as a protective film-attached substrate.

The pressure-sensitive adhesive layer-attached stack was placed on a precision stage that can be driven in Z-axis (hereinafter also referred to as Z-drive stage) in an arrangement such that the pressure-sensitive adhesive layer is the uppermost layer.

Then, the PET film-attached glass plate was fixed above the pressure-sensitive adhesive layer-attached stack that was placed on the Z-drive stage (i.e., above the pressure-sensitive adhesive layer) such that the PET film of the PET film-attached glass plate was located at the lower side (i.e., such that the pressure-sensitive adhesive layer and the PET film faced each other). In this process, adjustment was carried out to arrange the pressure-sensitive adhesive layer and the PET film to be parallel to each other.

Thereafter, the pressure-sensitive adhesive layer-attached stack was vertically moved upward by moving the Z-drive stage, thereby allowing the pressure-sensitive adhesive layer in the pressure-sensitive adhesive layer-attached stack to contact the PET film of the PET film-attached glass plate. In this process, absence of air incorporation at the interface between the PET film and the pressure-sensitive adhesive layer was confirmed by visual inspection from the glass plate side of the PET film-attached glass plate.

Then pipes for introduction of nitrogen gas were connected to the through-holes (i.e., the air vent openings) of the pellicle frame in the stack. Through the pipes, nitrogen gas was introduced into the closed space enclosed by the inner peripheral face of the pellicle frame, the pellicle film, and the photomask, to adjust the pressure of the closed space to a positive pressure of about 5 kPa. The pellicle film in the pressure-sensitive adhesive layer-attached stack was upwardly expanded thereby, to adhere the pressure-sensitive adhesive layer on the pellicle film and the PET film of the PET film-attached glass plate in a pressure-sensitive manner.

Demounting Step

Thereafter, the pressure-sensitive adhesive layer-attached stack was vertically moved downward by moving the Z-drive stage, to separate the photomask-side part of the pressure-sensitive adhesive layer-attached stack from the PET film of the PET film-attached glass plate, and to thereby forcibly break the pellicle film in the pressure-sensitive adhesive layer-attached stack. Through these operations, the pellicle film and the pressure-sensitive adhesive layer of the pressure-sensitive adhesive layer-attached stack were demounted.

Then, the second stack (i.e., a stack including a photomask, a mask adhesion layer, and a pellicle frame) left after the demounting of the pellicle film and the pressure-sensitive adhesive layer was placed on a hot plate in an orientation such that the photomask and the hot plate contact each other, and the second stack was heated at about 70° C. for 5 minutes. The adhesion power of the mask adhesion layer was thereby reduced.

Subsequently, the pellicle frame of the second stack was demounted using a lever while using the handling holes provided on the outer peripheral face of the pellicle frame as points of loading.

As a result of the foregoing process, the pellicle (i.e., a pellicle including a pellicle film and a pellicle frame) was demounted from the photomask in the pressure-sensitive adhesive layer-attached stack.

Checking of Photomask Contamination

The appearance of the photomask from which the pellicle was demounted was visually observed, and attachment of foreign matters (i.e., contamination) was not found.

Comparative Example 1

The same operations as those in the step of providing a stack in Example 1 were carried out to provide the same stack as that in Example 1 (i.e., a stack that includes a photomask, a mask adhesion layer, a pellicle frame, a pellicle film adhesion layer, and a pellicle film that are arranged in this order). However, the step of forming a pressure-sensitive adhesive layer and the step of adhering a protective film in a pressure-sensitive manner were not carried out.

Thereafter, the stack provided above was placed on a hot plate in an orientation such that the photomask and the hot plate contact each other, and the stack was heated at about 70° C. for 5 minutes. The adhesion power of the mask adhesion layer was thereby reduced.

Subsequently, the pellicle (i.e., a pellicle including a pellicle frame and a pellicle film) of the stack was demounted using a lever while using the handling holes provided on the outer peripheral face of the pellicle frame as points of loading. In this demounting operation, breakage of the self-standing portion of the pellicle film was found.

The appearance of the photomask after the pellicle was demounted was visually observed, and attachment of pellicle film pieces to the photomask surface due to breakage of the pellicle film (i.e., photomask contamination) was found.

The disclosure of Japanese Patent Application No. 2019-225699, filed Dec. 13, 2019, is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

The invention claimed is:

1. A pellicle demounting method, comprising:
   providing a stack including a photomask, a pellicle frame, and a pellicle film that are arranged in this order;
   forming only a pressure-sensitive adhesive layer on the pellicle film; and
   a demounting step of demounting at least the pellicle film, the pellicle frame, and the pressure-sensitive adhesive layer all at once from the photomask in the stack having the pressure-sensitive adhesive layer formed thereon,
   wherein the entire pellicle film is demounted in the demounting step.

2. The pellicle demounting method according to claim 1, wherein, in the forming of a pressure-sensitive adhesive layer, the pressure-sensitive adhesive layer is formed using a spray coating method, a spin coating method, an inkjet method, a screen printing method, or a dip coating method.

3. The pellicle demounting method according to claim 1, wherein, in the forming of a pressure-sensitive adhesive layer, the pressure-sensitive adhesive layer is formed using a spray coating method.

4. The pellicle demounting method according to claim 1, wherein the pressure-sensitive adhesive layer includes at least one pressure-sensitive adhesive selected from the group consisting of a silicone-based pressure-sensitive adhesive, an acrylic pressure-sensitive adhesive, a urethane-based pressure-sensitive adhesive, a polyamide-based pressure-sensitive adhesive, a polyester-based pressure-sensitive adhesive, an ethylene-vinyl acetate copolymer, an olefin-based pressure-sensitive adhesive, a polybutadiene-based pressure-sensitive adhesive, a rubber-based pressure-sensitive adhesive, and a styrene-based pressure-sensitive adhesive.

5. The pellicle demounting method according to claim 1, wherein the stack further comprises a mask adhesion layer provided between the photomask and the pellicle frame.

6. A pellicle demounting method, comprising:
   providing a first stack including a photomask, a mask adhesion layer, a pellicle frame, and a pellicle film that are arranged in this order;
   forming only a pressure-sensitive adhesive layer on the pellicle film;
   demounting the pellicle film and the pressure-sensitive adhesive layer while leaving the pellicle frame at a photomask-side part of the first stack having the pressure-sensitive adhesive layer formed thereon, to obtain a second stack that includes the photomask, the mask adhesion layer, and the pellicle frame;
   heat-treating the second stack; and
   demounting the pellicle frame from the photomask in the second stack,
   wherein the entire pellicle film is demounted in the demounting step.

7. The pellicle demounting method according to claim 1, further comprising heat-treating the stack prior to the demounting step.

8. The pellicle demounting method according to claim 1, wherein at least one of a recess portion or a cutout is provided on an outer peripheral face of the pellicle frame.

9. The pellicle demounting method according to claim 1, wherein a through-hole penetrating through the pellicle film and the pellicle frame in a thickness direction is provided at the stack.

\* \* \* \* \*